(12) United States Patent
Okabe et al.

(10) Patent No.: US 8,062,440 B2
(45) Date of Patent: Nov. 22, 2011

(54) HAFNIUM ALLOY TARGET AND PROCESS FOR PRODUCING THE SAME

(75) Inventors: Takeo Okabe, Ibaraki (JP); Shuichi Irumata, Ibaraki (JP); Yasuhiro Yamakoshi, Ibaraki (JP); Hirohito Miyashita, Ibaraki (JP); Ryo Suzuki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 748 days.

(21) Appl. No.: 12/204,069

(22) Filed: Sep. 4, 2008

(65) Prior Publication Data

US 2009/0000704 A1    Jan. 1, 2009

Related U.S. Application Data

(62) Division of application No. 10/548,347, filed as application No. PCT/JP2004/000448 on Jan. 21, 2004, now Pat. No. 7,459,036.

(30) Foreign Application Priority Data

Mar. 7, 2003   (JP) ................................ 2003-061084

(51) Int. Cl.
   *C23C 1/18*   (2006.01)
   *C23C 14/00*   (2006.01)
(52) U.S. Cl. ........ 148/668; 148/669; 148/670; 148/671; 148/672; 148/421; 438/785; 257/629
(58) Field of Classification Search ................... 148/668, 148/669, 670, 671, 672, 421; 438/785; 257/629
   See application file for complete search history.

(56) References Cited

U.S. PATENT DOCUMENTS

| | | | |
|---|---|---|---|
| 4,333,808 A | 6/1982 | Bhattacharyya et al. | |
| 4,619,695 A | 10/1986 | Oikawa et al. | |
| 4,770,948 A | 9/1988 | Oikawa et al. | |
| 5,196,916 A | 3/1993 | Ishigami et al. | |
| 5,330,589 A | 7/1994 | Cheng et al. | |
| 5,336,378 A | 8/1994 | Nishimura et al. | |
| 5,458,697 A | 10/1995 | Ishigami et al. | |
| 5,487,797 A * | 1/1996 | Dumas et al. ................. 148/672 |
| 5,679,983 A | 10/1997 | Ishigami et al. | |
| 6,207,589 B1 | 3/2001 | Ma et al. | |
| 6,723,183 B2 | 4/2004 | Oda et al. | |
| 6,861,030 B2 | 3/2005 | Shindo | |
| 6,986,834 B2 | 1/2006 | Irumata et al. | |
| 7,241,368 B2 | 7/2007 | Irumata et al. | |
| 2004/0170552 A1 | 9/2004 | Irumata et al. | |
| 2006/0189164 A1 | 8/2006 | Okabe et al. | |
| 2006/0266158 A1 | 11/2006 | Shindo | |
| 2007/0018138 A1 | 1/2007 | Shindo | |

FOREIGN PATENT DOCUMENTS

| | | |
|---|---|---|
| EP | 0902102 A1 | 3/1999 |
| JP | 02-015167 A | 1/1990 |
| JP | 05-214521 A | 8/1993 |
| JP | 06-306597 A | 11/1994 |
| JP | 10-060631 A | 3/1998 |
| JP | 2003-017491 A | 1/2003 |

OTHER PUBLICATIONS esp@cenet database, one page English Abstract of JP 61-107728, May 26, 1986.
esp@cenet database, one page English Abstract of JP 61-145828, Jul. 3, 1986.
esp@cenet database, one page English Abstract of JP 04-218912, Aug. 10, 1992.
CAPLUS database, one page English Abstract of JP 60-024342 A, Feb. 7, 1985.
CAPLUS database, one page English Abstract of JP 59-208044 A, Nov. 26, 1984.
CAPLUS database, one page English Abstract of JP 11-264885 A, Sep. 28, 1999.

* cited by examiner

*Primary Examiner* — Sikyin Ip
(74) *Attorney, Agent, or Firm* — Howson & Howson LLP

(57) ABSTRACT

A hafnium alloy target containing either or both of Zr and Ti in a gross amount of 100 wtppm-10 wt % in Hf, wherein the average crystal grain size is 1-100 μm, the impurities of Fe, Cr and Ni are respectively 1 wtppm or less, and the habit plane ratio of the plane {002} and three planes {103}, {014} and {015} lying within 35° from {002} is 55% or greater, and the variation in the total sum of the intensity ratios of these four planes depending on locations is 20% or less. As a result, obtained is a hafnium alloy target having favorable deposition property and deposition speed, which generates few particles, and which is suitable for forming a high dielectric gate insulation film such as HfO or HfON film, and the manufacturing method thereof.

5 Claims, No Drawings

HAFNIUM ALLOY TARGET AND PROCESS FOR PRODUCING THE SAME

CROSS REFERENCE TO RELATED APPLICATIONS

This application is a divisional of U.S. application Ser. No. 10/548,347, now U.S. Pat. No. 7,459,036, which is the National Stage of International Application No. PCT/JP04/00448, filed Jan. 21, 2004, which claims the benefit under 35 USC §119 of Japanese Application No. 2003-061084, filed Mar. 7, 2003.

BACKGROUND OF THE INVENTION

The present invention relates to a hafnium alloy target having favorable deposition property and deposition speed, which generates few particles, and which is suitable for forming a high dielectric gate insulation film such as a HfO or HfON film, as well as to the manufacturing method thereof. Incidentally, the unit of "ppm" as used in this description shall mean wtppm in all cases.

The film thickness of a dielectric gate insulation film is largely influenced by the performance of a MOS transistor, and it is essential that the interface with the silicon substrate is electrically smooth and that the mobility of the carrier does not deteriorate.

Conventionally, a $SiO_2$ film has been used as this gate insulation film, and was the most superior in terms of interfacial quality heretofore. In addition, there is a characteristic in that the thinner the $SiO_2$ film used as this gate insulation film, the number of carriers (that is, electrons or electron holes) increases, and the drain current also increases thereby.

From the foregoing circumstances, each time the power supply voltage would decrease as a result of miniaturizing the wiring, the gate $SiO_2$ film has been consistently formed as thin as possible within a range that would not deteriorate the reliability of dielectric breakdown. Nevertheless, a tunnel leakage current flows directly when the gate $SiO_2$ film is formed of a thickness of 3 m or less, and a problem arises in that this film would not function as an insulation film.

Meanwhile, although attempts are being made to miniaturize the transistor, so as long as there are limitations in the film thickness of the $SiO_2$ film, which is the gate insulation film as described above, miniaturization of the transistor loses its significance, and a problem arises in that the performance is not improved.

Moreover, in order to lower the power supply voltage of the LSI as well as lower the power consumption, it is necessary to make the gate insulation film even thinner. Nevertheless, since there is a problem regarding the gate dielectric breakdown when the film thickness of the $SiO_2$ film is made 3 nm or less as described above, thinning of the film had a limitation in itself.

In light of the above, as a candidate for the next-generation gate insulation film, HfO and HfON having a higher dielectric constant in comparison to a conventional SiO or SiON are being considered as a strong candidate. This film is deposited by subjecting an Hf target to reactive sputtering with oxygen or nitrogen.

Several patent applications; for instance, a patent application pertaining to the target to be used in such deposition, manufacturing method thereof and formation of an oxide film (c.f. Japanese Patent Laid-Open Publication No. H11-40517), and patents relating to a semiconductor element (c.f. U.S. Pat. Nos. 4,333,808 and 6,207,589) have been disclosed.

Patent document Japanese Patent Laid-Open Publication No. H4-358030 describes that the impurities of an Hf target are Al: 10 ppm or less. Further, patent document Japanese Patent Laid-Open Publication No. H8-53756 and patent document Japanese Patent Laid-Open Publication No. H8-60350 describe that the impurities are Fe: 10 ppm or less, Ni: 10 ppm or less, Cr: 10 ppm or less, and Al: 10 ppm or less.

Patent document EPO 0915117 describes that the impurities are Fe: 10 ppm or less, Ni: 10 ppm or less, Cr: 10 ppm or less, Al: 10 ppm or less, oxygen: 250 ppm or less, Na: 0.1 ppm or less, K: 0.1 ppm or less, U: 0.001 ppm or less, and Th: 0.001 ppm or less.

Further, it has been indicated that it is necessary to limit the impurities of Fe, Ni, Cr, Na, K, U and Th in a MoSi, WSi or Ti film used to form portions in the extreme vicinity of a gate electrode, drain or source, and there are descriptions of technology for prescribing the amount of impurities in the target (c.f. Japanese Patent Laid-Open Publication No. S60-66425, Japanese Patent Laid-Open Publication No. S61-107728, Japanese Patent Laid-Open Publication No. S61-145828, Japanese Patent Laid-Open Publication No. H2-213490, Japanese Patent Laid-Open Publication No. H4-218912).

Nevertheless, each of the foregoing conventional technology only prescribed certain impurities regarding the elementary substance Hf.

As a result of research concerning the deposition of an insulation film using an Hf target, there was a problem in that numerous particles were generated during deposition with a conventional single type elementary substance Hf. With this, it was difficult to reduce the number of particles to practical level even when the processing of suppressing the peeling of a film, which often occurs during the deposition of a metal film with strong adhesiveness known as pasting was performed, upon depositing TiN with a Ti target.

Further, in particular, when the amount of Fe, Ni or Cr is several ppm, it has been discovered that these elements diffuse to the Si substrate portion under the gate electrode, and deteriorate the device property. Moreover, there is variation in the thickness of the deposited insulation film, and there is a problem in that the device property of the wafer and other components would become varied.

A process referred to as burn-in is performed at the initial stages of sputtering, and the film thickness would not be stable unless the integral power consumption is 20 kWHr or more.

Further, in order to improve the deposition property and deposition speed in the future, although the increase in sputtering power may be considered, in such a case, with a conventional bonding method that uses brazing filler metal, it is anticipated that the brazing filler material will dissolve and the target would peel thereby.

SUMMARY OF THE INVENTION

In order to overcome the foregoing problems, an object of the present invention is to provide a hafnium alloy target with a property to replace a $SiO_2$ film, having favorable deposition property and deposition speed, which generates few particles, and which is suitable for forming a high dielectric gate insulation film such as a HfO or HfON film, as well as to the manufacturing method thereof.

The present invention provides a hafnium alloy target containing either or both of Zr and Ti in a gross amount of 100 wtppm-10 wt % in Hf. Preferably, the average crystal grain size of the target is 1-100 μm, and the impurities of Fe, Cr and Ni are respectively 1 wtppm or less. Also, preferably the habit plane ratio of the plane {002} and three planes {103}, {014} and {015} lying within 35° from {002} is 55% or greater, and the variation in the total sum of the intensity ratios of these four planes depending on locations is 20% or less. Further, preferably the average roughness Ra of the erosion face of the target is 0.01-2 μm, and the average roughness Ra of the non-erosion face of the target is 2-50 μm.

The present invention also provides a method of manufacturing method the hafnium alloy target discussed above. An ingot or billet of a hafnium alloy is subject to hot forging and hot rolling or cold rolling, and is further heated to 800-1300° C. for 15 minutes or longer in the atmosphere, in a vacuum, or in an inert gas atmosphere. Preferably, the hafnium alloy target is diffusion bonded to a backing plate, wherein Al or Al alloy, Cu or Cu alloy, or Ti or Ti alloy is used as the backing plate. Further, preferably the non-erosion face on the side face or the like of the target is made to have an average roughness Ra of 2-50 μm via bead blasting, etching and formation of a spray coated film.

DETAILED DESCRIPTION OF THE INVENTION

The present invention is a hafnium alloy target containing either or both of Zr and Ti in a gross amount of 100 wtppm-10 wt % in Hf. As a result of adding Zr or Ti having similar chemical properties as Hf, deposition with the generation of few particles can be realized as follows without deteriorating insulation film properties such as deterioration in the dielectric constant or increase in leakage current.

In the present invention, the average crystal grain size is 1-100 μm. Thereby, the crystal grain size of the target will become miniaturized, and the generation of particles can be reduced. Incidentally, although it is effective to add Zr or Ti in excess of 10 wt % to simply miniaturize the grain size, since the deformation processing of the target will become difficult when the amount exceeds 10 wt %, the upper limit will be 10 wt %.

In the present invention, the impurities of Fe, Cr and Ni are respectively 1 wtppm or less. Since a gate oxide film will directly contact the switching unit of Si, it is necessary to lower the concentration of Fe, Ni and Co which will form energy levels in the band gap of Si.

The habit plane ratio of the plane {002} and three planes {103}, {014} and {015} lying within 35° from {002} is 55% or greater, and the variation in the total sum of the intensity ratios of these four planes depending on locations is 20% or less.

In order to suppress the thickness of the formed oxide film within a variation with no practical problem, it is necessary to control the crystal orientation. Regarding the close packed plane (002) and three planes (103), (014) and (015) lying within 35° from (002) to be the crystal habit planes, the ratio of the sum of the diffraction intensity ratio for these four planes against the sum of the diffraction intensity ratio for all diffracting planes is defined as the habit plane ratio according to the following equation.

$$\text{Habit plane ratio} = \frac{\frac{I(002)}{I*(002)} + \frac{I(103)}{I*(103)} + \frac{I(014)}{I*(014)} + \frac{I(015)}{I*(015)}}{\sum \frac{I(hkl)}{I*(hkl)}} \times 100$$

(hkl): Diffracting plane appearing when Hf powder is measured with X-ray diffraction
I(hkl): Measured intensity of (hkl)
I*(hkl): Relative intensity of JCPDS card By making the habit plane ratio 55% or greater and the variation in the habit plane ratio of the respective parts of the target within ±20%, it is possible to suppress the variation in the thickness of the oxide or oxynitride film deposited by sputtering this target to be within ±7%. When the habit plane ratio is less than 55%, even if the variation in the habit plane ratio is suppressed to be within ±20%, the other planes will become dominant, and the film thickness of the oxide or oxynitride film will become varied.

The average roughness Ra of the erosion face of the target is 0.01-2 μm. Thereby, the processed damage layer subject to high speed sputtering in the vicinity of the target surface can be reduced, and, by achieving a stable sputtering rate at an early stage, the amount of sputtering required for the burn-in; that is, the integral power consumption can be reduced.

Meanwhile, it is desirable to make the average roughness Ra of the non-erosion face of the target 2-50 μm. The non-erosion face of the target; that is, portions such as the side face of the target subject to deposition of unfavorable target substances as a result of sputtered substances flying thereon, is subject to bead blasting, etching and formation of a spray coated film in order to catch such flying substances and suppress the peeling of such substances. As a result, the number of particles on the wafer can be reduced.

Upon manufacturing the hafnium alloy target of the present invention, an ingot or billet of a hafnium alloy is subject to hot forging and hot rolling or cold rolling, and further heated to 800-1300° C. for 15 minutes or longer in the atmosphere, in a vacuum, or in an inert gas atmosphere.

Hot forging, hot rolling and cold rolling are combined to create an Hf alloy plate or block. Further, depending on the shape of the target, spinning processing may also be performed subsequently. During and at the end of such deformation processing, heat treatment is performed in the atmosphere, in a vacuum, or in an inert gas atmosphere at a retention temperature of 800-1300° C. and retention time of 15 minutes or longer. Thereafter, cutting work is performed according to the shape of the target, and, EB welding and the like are performed as necessary, to obtain a prescribed target shape. Nevertheless, depending on the target, bonding is not performed, and an integrated target may be formed.

Al or Al alloy, Cu or Cu alloy, or Ti or Ti alloy is used as the backing plate. In particular, it is desirable to employ diffusion bonding when bonding the target to the backing plate. As a result, it is possible to tolerate the temperature rise caused by high power sputtering.

EXAMPLES

Next, the Examples are explained. Further, these Examples are merely illustrative, and the present invention shall in no way be limited thereby. In other words, the present invention shall include all other modes or modifications other than these Examples within the scope of the technical spirit of this invention.

Example 1

A Hf-0.23 wt % Zr ingot was retained in the atmosphere at 1200° C. for 1 hour, and subject to hot forging. Subsequently, this was retained at 1000° C. for 1 hour, subject to hot rolling and formed into a discoid shape, and thereafter subject to heat treatment in the atmosphere at 1000° C.×1 hour. The average crystal grain size in this case was 35 μm. Incidentally, the amount of impurities was as follows: Na: <0.01, K: <0.01, Fe: <0.01, Ni: 0.25, Cr: <0.01, U: <0.001, Th: <0.001, Li: <0.01, Be: <0.01, Mg: <0.01, Al: <0.1, Si: 2, P: 0.2, Cl: <0.05, Ca:

<0.01, Ti: 0.07, Mn: <0.01, Cu: <0.05, Zn: 0.01, Nb: <0.05, Mo: 0.1, Ag: <0.05, W: 0.08, Au: <0.05, Hg: <0.05, Pb: <0.01, Bi: <0.01, O: 110, C: 30, N: <10 (unit is wtppm for all of the above). Further, <n is the detection limit of n (ppm), and signifies that no impurities were detected.

The habit plane ratio in this case was, regarding the target surface, 72% at the central part, 80% at the ½ radius portion, and 75% at the peripheral neighborhood. Regarding the bottom face of the Hf portion of the target, the habit plane ratio was 70% at the central part, 78% at the ½ radius portion, and 71% at the peripheral neighborhood, and, regarding the ½ thickness portion, 68% at the central part, 70% at the ½ radius portion, and 75% at the peripheral neighborhood.

The surface roughness of this target surface was finished to be Ra=0.3 µm, and the side face of the target was bead blasted to create a target in which the surface roughness was finished to be Ra=5 µm.

This target was used to deposit a HfO film on a Si wafer having a diameter of 200 mm. The film thickness achieved a steady value at a point in time when the film was deposited up to 5 kWH with integral power consumption.

Further, the film thickness distribution (1σ) and number of particles were measured when the film was deposited up to 5 kWH, 20 kWH and 100 kWH, and the result in order was 2.0%, 12 particles/wafer; 2.5%, 8 particles/wafer; and 2.4%, 15 particles/wafer, and both the film thickness distribution and number of particles showed favorable results. The device that created a gate insulation film with this target obtained favorable property.

Example 2

A Hf-300 wtppm Zr ingot was retained in the atmosphere at 1200° C. for 1 hour, and subject to hot forging. Subsequently, this was retained at 1000° C. for 1 hour, subject to hot rolling and formed into a discoid shape, and thereafter subject to heat treatment in the atmosphere at 1000° C.×1 hour. The average crystal grain size in this case was 70 µm. Incidentally, the amount of impurities was as follows: Na: <0.01, K: <0.01, Fe: 0.1, Ni: 0.8, Cr: 0.02, U: <0.001, Th: <0.001, Li: <0.01, Be: <0.01, Mg: <0.01, Al: <0.1, Si: 0.5, P: 0.1, Cl: <0.05, Ca: <0.01, Ti: 0.5, Mn: <0.01, Cu: <0.05, Zn: 0.01, Nb: <0.05, Mo: 4, Ag: <0.05, W: 0.02, Au: <0.05, Hg: <0.05, Pb: <0.01, Bi: <0.01, O: 80, C: 60, N: <10 (unit is wtppm for all of the above).

The habit plane ratio in this case was, regarding the target surface, 63% at the central part, 61% at the ½ radius portion, and 70% at the peripheral neighborhood. Regarding the back face of the target, the habit plane ratio was 59% at the central part, 63% at the ½ radius portion, and 69% at the peripheral neighborhood, and, regarding the ½ thickness portion, 66% at the central part, 60% at the ½ radius portion, and 63% at the peripheral neighborhood.

The surface roughness of this target surface was finished to be Ra=0.25 µm, and the side face of the target was bead blasted to create a target in which the surface roughness was finished to be Ra=10 µm.

This target was used to deposit a HfO film on a Si wafer having a diameter of 200 mm. The film thickness achieved a steady value at a point in time when the film was deposited up to 5 kWH with integral power consumption.

Further, the film thickness distribution and number of particles were measured when the film was deposited up to 5 kWH, 20 kWH and 100 kWH, and the result in order was 1.5%, 15 particles/wafer; 2.3%, 17 particles/wafer; and 2.3%, 20 particles/wafer, and both the film thickness distribution and number of particles showed favorable results.

Example 3

A Hf-4.7 wt % Zr ingot was retained in the atmosphere at 1200° C. for 1 hour, and subject to hot forging. Subsequently, this was retained at 1000° C. for 1 hour, subject to hot rolling and formed into a discoid shape, and thereafter subject to heat treatment in the atmosphere at 900° C.×1 hour. The average crystal grain size in this case was 10 µm. Incidentally, the amount of impurities was as follows: Na: <0.01, K: <0.01, Fe: 0.04, Ni: 0.02, Cr: <0.01, U: <0.001, Th: <0.001, Li: <0.02, Be: <0.01, Mg: <0.01, Al: 12, Si: 0.9, P: 0.2, Cl: 0.1, Ca: <0.01, Ti: 0.09, Mn: <0.01, Cu: <0.05, Zn: 0.03, Nb: <0.05, Mo: 0.1, Ag: <0.05, W: 0.15, Au: <0.05, Hg: <0.05, Pb: <0.01, Bi: <0.01, O: 80, C: 60, N: <10 (unit is wtppm for all of the above).

The habit plane ratio in this case was, regarding the target surface, 73% at the central part, 72% at the ½ radius portion, and 69% at the peripheral neighborhood. Regarding the back face of the target, the habit plane ratio was 65% at the central part, 72% at the ½ radius portion, and 66% at the peripheral neighborhood, and, regarding the ½ thickness portion, 69% at the central part, 67% at the ½ radius portion, and 70% at the peripheral neighborhood.

The surface roughness of this target surface was finished to be Ra=0.25 µm, and the side face of the target was bead blasted to create a target in which the surface roughness was finished to be Ra=5 µm.

This target was used to deposit a HfO film on a Si wafer having a diameter of 200 mm. The film thickness achieved a steady value at a point in time when the film was deposited up to 7 kWH with integral power consumption.

Further, the film thickness distribution and number of particles were measured when the film was deposited up to 7 kWH, 20 kWH and 100 kWH, and the result in order was 2.8%, 13 particles/wafer; 3.2%, 17 particles/wafer; and 2.3%, 24 particles/wafer, and both the film thickness distribution and number of particles showed favorable results.

Example 4

A Hf-1 wt % Ti ingot was retained in the atmosphere at 1200° C. for 1 hour, and subject to hot forging. Subsequently, this was retained at 1000° C. for 1 hour, subject to hot rolling and formed into a discoid shape, and thereafter subject to heat treatment in the atmosphere at 900° C.×1 hour. The average crystal grain size in this case was 60 µm. Incidentally, the amount of impurities was as follows: Na: <0.01, K: <0.01, Fe: 0.04, Ni: 0.02, Cr: <0.01, U: <0.001, Th: <0.001, Li: <0.02, Be: <0.01, Mg: <0.01, Al: 12, Si: 0.9, P: 0.2, Cl: 0.1, Ca: <0.01, Mn: <0.01, Cu: <0.05, Zn: 0.03, Nb: <0.05, Zr: 20, Mo: 0.1, Ag: <0.05, W: 0.15, Au: <0.05, Hg: <0.05, Pb: <0.01, Bi: <0.01, O: 80, C: 60, N: <10 (unit is wtppm for all of the above).

The habit plane ratio in this case was, regarding the target surface, 63% at the central part, 64% at the ½ radius portion, and 68% at the peripheral neighborhood. Regarding the back face of the target, the habit plane ratio was 60% at the central part, 69% at the ½ radius portion, and 64% at the peripheral neighborhood, and, regarding the ½ thickness portion, 70% at the central part, 65% at the ½ radius portion, and 71% at the peripheral neighborhood.

The surface roughness of this target surface was finished to be Ra=0.3 µm, and the side face of the target was bead blasted to create a target in which the surface roughness was finished to be Ra=7 µm.

This target was used to deposit a HfO film on a Si wafer having a diameter of 200 mm. The film thickness achieved a steady value at a point in time when the film was deposited up to 5 kWH with integral power consumption.

Further, the film thickness distribution and number of particles were measured when the film was deposited up to 5 kWH, 20 kWH and 100 kWH, and the result in order was 1.5%, 18 particles/wafer; 1.9%, 20 particles/wafer; and 2.4%, 21 particles/wafer, and both the film thickness distribution and number of particles showed favorable results.

Example 5

The same ingot and the target that was subject to deformation processing and heat treatment as in Example 1 were formed into a target shape by applying pressure of 100-2000 Kgf/cm$^2$ at a temperature of 250-600° C., and, for instance, diffusion bonding this to high-strength Al alloy such as A5052 or A6061. Although the same deposition results as Example 1 could be obtained even when this target was sputtered with an output of 10 kW, with the bonding method of brazing using In as the brazing filler material, In will dissolve and the target will peel. Incidentally, when diffusion bonding the target to high-strength Cu alloy, it is necessary to perform such bonding at a temperature of 250-950° C. and pressure of 100-2000 Kgf/cm$^2$.

Comparative Example 1

A Hf-50 wtppm Zr ingot was retained in the atmosphere at 1200° C. for 1 hour, and subject to hot forging. Subsequently, this was retained at 1000° C. for 1 hour, subject to hot rolling and formed into a discoid shape, and thereafter subject to heat treatment in the atmosphere at 1000° C.×1 hour. The average crystal grain size in this case was 350 μm. Incidentally, the amount of impurities was as follows: Na: <0.01, K: <0.01, Fe: <0.01, Ni: 0.10, Cr: <0.01, U: <0.001, Th: <0.001, Li: <0.01, Be: <0.01, Mg: <0.01, Al: <0.1, Si: 1.5, P: 0.3, Cl: <0.05, Ca: <0.01, Ti: 0.16, Mn: <0.01, Cu: <0.05, Zn: 0.01, Nb: <0.05, Mo: 3, Ag: <0.05, W: 0.08, Au: <0.05, Hg: <0.05, Pb: <0.01, Bi: <0.01, O: 80, C: 40, N: <10 (unit is wtppm for all of the above).

The habit plane ratio in this case was, regarding the target surface, 69% at the central part, 75% at the ½ radius portion, and 74% at the peripheral neighborhood.

The surface roughness of this target surface was finished to be Ra=0.3 μm, and the side face of the target was bead blasted to create a target in which the surface roughness was finished to be Ra=6 μm.

This target was used to deposit a HfO film on a Si wafer having a diameter of 200 mm.

The film thickness achieved a steady value at a point in time when the film was deposited up to 5 kWH with integral power consumption. Further, the film thickness distribution (1 σ) and number of particles were measured when the film was deposited up to 5 kWH, 20 kWH and 100 kWH, and the result in order was 2.2%, 150 particles/wafer; 1.5%, 210 particles/wafer; and 1.9%, 260 particles/wafer, and, although the film thickness distribution was favorable, numerous particles were generated and the target was unsuitable for practical use.

Comparative Example 2

A Hf-15 wt % Zr ingot was retained in the atmosphere at 1300° C. for 1 hour, and subject to hot forging. Nevertheless, since the deformation during forging was extremely small, it was necessary to reheat this numerous times during the forging process. Further, much time and high costs were required to form the ingot into a discoid shape via deformation processing, and this was impractical for commercial use.

Comparative Example 3

A Hf-0.19 wt % Zr ingot was retained in the atmosphere at 1200° C. for 1 hour, and subject to hot forging. Subsequently, this was retained at 1000° C. for 1 hour, subject to hot rolling and formed into a discoid shape, and thereafter subject to heat treatment in the atmosphere at 1000° C.×1 hour. The average crystal grain size in this case was 55 μm. Incidentally, the amount of impurities was as follows: Na: <0.01, K: <0.01, Fe: 3, Ni: 8, Cr: 1.5, U: <0.001, Th: <0.001, Li: <0.01, Be: <0.01, Mg: <0.01, Al: <0.1, Si: 2.1, P: 0.3, Cl: <0.05, Ca: <0.01, Ti: 0.07, Mn: <0.01, Cu: <0.05, Zn: <0.01, Nb: <0.05, Mo: 2, Ag: <0.05, W: 0.13, Au: <0.05, Hg: <0.05, Pb: <0.01, Bi: <0.01, O: 120, C: 200, N: <10 (unit is wtppm for all of the above).

The habit plane ratio in this case was, regarding the target surface, 69% at the central part, 75% at the ½ radius portion, and 74% at the peripheral neighborhood.

The surface roughness of this target surface was finished to be Ra=0.3 μm, and the side face of the target was sandblasted to create a target in which the surface roughness was finished to be Ra=6 μm.

This target was used to deposit a HfO film on a Si wafer having a diameter of 200 mm. The film thickness achieved a steady value at a point in time when the film was deposited up to 5 kWH with integral power consumption.

Further, the film thickness distribution (1 σ) and number of particles were measured when the film was deposited up to 5 kWH, 20 kWH and 100 kWH, and the result in order was 2.2%, 12 particles/wafer; 1.5%, 20 particles/wafer; and 1.9%, 25 particles/wafer, and, although both the film thickness distribution and number of particles were favorable, the variation in the property of the device having the gate insulation film formed with this target was significant, and it was not possible to create an integrated circuit.

Comparative Example 4

A portion cut out from the same ingot as Example 1 was retained at 1000° C. for 1 hour upon omitting the hot forging process, subsequently subject to hot rolling and formed into a discoid shape, and thereafter subject to heat treatment in the atmosphere at 1000° C.×1 hour. Thus, the composition (Hf-0.23 wt % Zr) and amount of impurities are both the same as Example 1.

The crystal grain size in this was 65 μm, the habit plane ratio was, regarding the target surface, 75% at the central part, 35% at the ½ radius portion, and 45% at the peripheral neighborhood.

The surface roughness of this target surface was finished to be Ra=0.3 μm, and the side face of the target was bead blasted to create a target in which the surface roughness was finished to be Ra=5 μm.

This target was used to deposit a HfO film on a Si wafer having a diameter of 200 mm. The film thickness achieved a steady value at a point in time when the film was deposited up to 5 kWH with integral power consumption, but the film thickness distribution at 5 kWH and 20 kWH was large at 20% and 18%, respectively, and it was impractical.

Comparative Example 5

A portion cut out from the same ingot as Example 1 was subject to deformation processing and heat treatment, and manufactured into a target. The average crystal grain size in this case was 35 μm.

The habit plane ratio in this case was, regarding the target surface, 75% at the central part, 64% at the ½ radius portion, and 66% at the peripheral neighborhood. Regarding the back face of the target, the habit plane ratio was 74% at the central part, 68% at the ½ radius portion, and 73% at the peripheral neighborhood, and, regarding the ½ thickness portion, 63% at the central part, 65% at the ½ radius portion, and 69% at the peripheral neighborhood.

The surface roughness of this target surface was finished to be Ra=0.3 μm, and the side face of the target was subject to lathe turning to create a target in which the surface roughness was finished to be Ra=1.5 μm.

This target was used to deposit a HfO film on a Si wafer having a diameter of 200 mm. The film thickness achieved a steady value at a point in time when the film was deposited up to 5 kWH with integral power consumption. Further, the film thickness distribution (1 σ) and number of particles were measured when the film was deposited up to 5 kWH, 20 kWH and 100 kWH, and the result in order was 2.0%, 12 particles/wafer; 2.5%, 35 particles/wafer; and 2.4%, 105 particles/wafer, and, although the film thickness distribution was favorable, the number of particles increased as the target was used.

Comparative Example 6

A portion cut out from the same ingot as Example 1 was subject to deformation processing and heat treatment, and manufactured into a target. The average crystal grain size in this case was 42 μm.

The habit plane ratio in this case was, regarding the target surface, 65% at the central part, 71% at the ½ radius portion, and 72% at the peripheral neighborhood. Regarding the back face of the target, the habit plane ratio was 63% at the central part, 73% at the ½ radius portion, and 67% at the peripheral neighborhood, and, regarding the ½ thickness portion, 60% at the central part, 63% at the ½ radius portion, and 65% at the peripheral neighborhood.

The surface roughness of this target surface was subject to lathe turning to be Ra=1.7 μm, and the side face of the target was subject to blast processing to create a target in which the surface roughness was finished to be Ra=5 μm.

This target was used to deposit a HfON film on a Si wafer having a diameter of 200 mm. It took up to 20 kWH for the film thickness to achieve a steady value with integral power consumption.

The present invention yields a superior effect in that it provides a hafnium alloy target having favorable deposition property and deposition speed, which generates few particles, and which is suitable for forming a high dielectric gate insulation film such as HfO or HfON film, and the manufacturing method thereof.

We claim:

1. A method of manufacturing a hafnium alloy target, comprising the steps of hot forging and rolling an ingot or billet of hafnium alloy and thereafter heating said ingot or billet to 800-1300° C. for at least 15 minutes in an atmosphere, a vacuum, or an inert gas atmosphere, said rolling step is hot rolling or cold rolling, and said target is produced such that said target contains at least one of Zr and Ti in a gross amount of 100 wtppm-10 wt % in Hf and has a habit plane ratio of a plane {002} and of three planes {103}, {014} and {015} lying within 35° from {002} of at least 55%, a variation in a total sum of intensity ratios of these four planes depending on locations of 20% or less, an average crystal grain size of 1-100 μm, impurities of Fe, Cr and Ni of 1 wtppm or less, respectively, and an average roughness Ra of an erosion face of said target of 0.01-2 μm.

2. A method according to claim 1, further comprising the step of diffusion bonding the hafnium alloy target to a backing plate.

3. A method according to claim 2, wherein the backing plate is made of the material selected from the group consisting of Al, an Al alloy, Cu, the Cu alloy, Ti and the Ti alloy.

4. A method according to claim 3, further comprising the step of bead blasting, etching or metal spraying a non-erosion face of the target to provide the non-erosion face with an average roughness Ra of 2-50 μm.

5. A method according to claim 1, further comprising the step of bead blasting, etching or metal spraying a non-erosion face of the target to provide the non-erosion face with an average roughness Ra of 2-50 μm.

* * * * *

UNITED STATES PATENT AND TRADEMARK OFFICE
CERTIFICATE OF CORRECTION

| | |
|---|---|
| PATENT NO. | : 8,062,440 B2 |
| APPLICATION NO. | : 12/204069 |
| DATED | : November 22, 2011 |
| INVENTOR(S) | : Takeo Okabe et al. |

It is certified that error appears in the above-identified patent and that said Letters Patent is hereby corrected as shown below:

Column 1, line 41, "3 m" should read "3nm".

Signed and Sealed this
Thirteenth Day of March, 2012

David J. Kappos
*Director of the United States Patent and Trademark Office*